(12) United States Patent
Tahara

(10) Patent No.: US 11,302,607 B2
(45) Date of Patent: Apr. 12, 2022

(54) CIRCUIT DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Hideaki Tahara, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 187 days.

(21) Appl. No.: 16/621,105

(22) PCT Filed: Jun. 19, 2018

(86) PCT No.: PCT/JP2018/023287
§ 371 (c)(1),
(2) Date: Dec. 10, 2019

(87) PCT Pub. No.: WO2019/004009
PCT Pub. Date: Jan. 3, 2019

(65) Prior Publication Data
US 2020/0211926 A1 Jul. 2, 2020

(30) Foreign Application Priority Data
Jun. 28, 2017 (JP) .............................. JP2017-126355

(51) Int. Cl.
*H01L 23/42* (2006.01)
*H01L 23/433* (2006.01)
(Continued)

(52) U.S. Cl.
CPC .......... *H01L 23/433* (2013.01); *H01L 23/467* (2013.01); *H01L 23/538* (2013.01);
(Continued)

(58) Field of Classification Search
CPC ......... H01L 23/467; H01L 23/36–3738; H01L 25/0652; H01L 25/071; H01L 25/112; H02G 3/03; H02G 3/081
See application file for complete search history.

(56) References Cited

U.S. PATENT DOCUMENTS 10,998,903 B1 * 5/2021 Vinciarelli ............ H03K 17/691
11,069,383 B1 * 7/2021 Tsoukatos .......... G11B 33/1413
(Continued)

FOREIGN PATENT DOCUMENTS

JP 2000-196011 A 7/2000
JP 2003-164040 A 6/2003
JP 2003-332526 A 11/2003

OTHER PUBLICATIONS

International Search Report, Application No. PCT/JP2018/023287, dated Jul. 31, 2018.

*Primary Examiner* — Jarrett J Stark
(74) *Attorney, Agent, or Firm* — Honigman LLP

(57) ABSTRACT

A circuit device includes a circuit component electrically connected to a conductor and a first heat dissipation member includes an insulation member interposed between the conductor and the attachment surface. A control element outputs a control signal, a circuit board is spaced apart from the first heat dissipation member and the conductor. A housing member includes a housing chamber housing the circuit component and the circuit board, a heat dissipation chamber through which air flows while being in contact with a heat dissipation surface of a second heat dissipation member, and a partition plate has a plurality of communication holes placing the heat dissipation chamber and the housing chamber in communication with each other. A portion of the first heat dissipation member excluding the attachment surface
(Continued)

and a portion of the second heat dissipation member excluding the heat dissipation surface are in contact with air outside the circuit device.

7 Claims, 8 Drawing Sheets

(51) Int. Cl.
    *H01L 23/467*     (2006.01)
    *H01L 23/538*     (2006.01)
    *H01L 25/07*     (2006.01)
    *H02G 3/03*     (2006.01)
    *H02G 3/08*     (2006.01)
    *H02G 3/16*     (2006.01)

(52) U.S. Cl.
    CPC ............ *H01L 25/072* (2013.01); *H02G 3/03* (2013.01); *H02G 3/081* (2013.01); *H02G 3/088* (2013.01); *H02G 3/16* (2013.01)

(56) References Cited

U.S. PATENT DOCUMENTS

| | | | |
|---|---|---|---|
| 2002/0159237 A1* | 10/2002 | Patel ..................... | H01L 23/427 |
| | | | 361/719 |
| 2007/0025079 A1* | 2/2007 | Salmon ............... | H01L 23/3171 |
| | | | 361/688 |
| 2011/0228498 A1 | 9/2011 | Kawai et al. | |
| 2017/0084514 A1* | 3/2017 | Kumari ................. | H01L 23/473 |
| 2017/0112018 A1* | 4/2017 | Krivonak ........... | H05K 7/20263 |
| 2017/0162465 A1* | 6/2017 | Matsui .................. | H01L 23/367 |
| 2017/0229368 A1* | 8/2017 | Chiu ..................... | H01L 23/055 |
| 2018/0049349 A1* | 2/2018 | Voss ..................... | H01L 23/367 |
| 2018/0157297 A1* | 6/2018 | Delano .................. | G06F 1/203 |
| 2018/0242469 A1* | 8/2018 | Suzuki ................. | G06F 3/0688 |
| 2018/0278034 A1* | 9/2018 | Chin ................... | B60R 16/0238 |
| 2018/0375307 A1* | 12/2018 | Kita ..................... | H02G 3/081 |
| 2019/0326192 A1* | 10/2019 | Eid ........................ | H01L 24/16 |
| 2020/0381905 A1* | 12/2020 | Sasaki ................... | H05K 5/068 |
| 2020/0395264 A1* | 12/2020 | Choi .................. | H01L 25/0657 |

\* cited by examiner

CIRCUIT DEVICE

CROSS-REFERENCE TO RELATED APPLICATIONS

This application is the U.S. national stage of PCT/JP2018/023287 filed on Jun. 19, 2018, which claims priority of Japanese Patent Application No. JP 2017-126355 filed on Jun. 28, 2017, the contents of which are incorporated herein.

TECHNICAL FIELD

The present disclosure relates to a circuit device.

BACKGROUND

Vehicles are equipped with an electrical junction box that is connected to a power supply and loads, such as head lamps or wipers. The electrical junction box electrically connects the power supply and the loads to each other or interrupts the electrical connection. A circuit assembly that is housed in an electrical junction box is disclosed in JP 2003-164040A, for example. In the circuit assembly described in JP 2003-164040A, a plurality of plate-shaped conductors are placed on a placement surface of a heat dissipation member with an insulation member interposed therebetween, and plate surfaces on one side of the conductors face the placement surface. One end and another end of a semiconductor switch are respectively connected to two of the plurality of conductors. The one end of the semiconductor switch is connected to the battery via one of the two conductors, and the other end of the semiconductor switch is connected to the load via the other of the two conductors.

A circuit board is arranged on plate surfaces on the other side of the plurality of conductors, and a plate surface of the circuit board faces the plate surfaces on the other side of the conductors. A control element is arranged on the other plate surface of the circuit board, and the control element outputs control signals for turning the semiconductor switch ON or OFF. If the control element outputs a control signal for turning the semiconductor switch ON, the semiconductor switch is switched ON and power is supplied from the battery to the load with current flowing via the semiconductor switch. If the control element outputs a control signal for turning the semiconductor switch OFF, the semiconductor switch is switched OFF and power supply from the battery to the load is stopped with the flow of current via the semiconductor switch being interrupted.

When current is flowing via the semiconductor switch, the semiconductor switch generates heat. The heat generated by the semiconductor switch is conducted by the conductors and the heat dissipation member in this order, and dissipates from the heat dissipation member.

In the circuit assembly described in JP 2003-164040A, the heat dissipation member, the conductors, the circuit board, and the control element are arranged in this order in proximity to each other. Therefore, heat generated by the semiconductor switch is conducted via the conductors and the circuit board to the control element. Accordingly, if the temperature of the semiconductor switch increases, the control element is affected by the increase in the temperature of the semiconductor switch and the temperature of the control element also increases.

If the control element has low heat resistance, the upper limit value of the temperature of the semiconductor switch up to which its normal operation is ensured is higher than the upper limit value of the temperature of the control element up to which its normal operation is ensured. In this case, operation of the semiconductor switch is controlled such that the temperature of the semiconductor switch does not become higher than or equal to the upper limit value of the temperature of the control element. For example, if the temperature of the semiconductor switch becomes close to the upper limit value of the temperature of the control element, the control element outputs a control signal to switch the semiconductor switch OFF and stop power supply via the semiconductor switch.

As described above, if the control element has low heat resistance, there is a problem in that the upper limit value of an allowable temperature of the semiconductor switch is limited by the upper limit value of the temperature of the control element up to which its normal operation is ensured.

As a measure to solve this problem, a control element that has high heat resistance can be used. However, control elements having high heat resistance are expensive, and therefore there is a problem in that the manufacturing cost increases.

The present disclosure was made in view of the above circumstances, and aims to provide a circuit device in which the upper limit value of an allowable temperature of a circuit component is not limited by the upper limit value of the temperature of a control element up to which its normal operation is ensured, a control element having low heat resistance can be used.

As a measure to solve this problem, a control element that has high heat resistance can be used. However, control elements having high heat resistance are expensive, and therefore there is a problem in that the manufacturing cost increases.

SUMMARY

The present disclosure was made in view of the above circumstances, and aims to provide a circuit device in which the upper limit value of an allowable temperature of a circuit component is not limited by the upper limit value of the temperature of a control element up to which its normal operation is ensured, a control element having low heat resistance can be used.

A circuit device according to one aspect of the present disclosure is a circuit device in which a circuit component is electrically connected to a conductor that is attached to an attachment surface of a first heat dissipation member with an insulation member interposed between the conductor and the attachment surface, and includes a control element that outputs a control signal for controlling operation of the circuit component, a circuit board on which the control element is arranged and that is spaced apart from the first heat dissipation member and the conductor, and a housing member that includes a housing chamber that houses the circuit component and the circuit board, a heat dissipation chamber through which air flows while being in contact with a heat dissipation surface of a second heat dissipation member, and a partition plate that separates the heat dissipation chamber and the housing chamber from each other and has a plurality of communication holes through which the heat dissipation chamber and the housing chamber are in communication with each other, wherein a portion of the first heat dissipation member excluding the attachment surface and a portion of the second heat dissipation member excluding the heat dissipation surface are in contact with air outside the circuit device.

Advantageous Effects of Disclosure

According to the above-described aspect, the upper limit value of an allowable temperature of the circuit component is not limited by the upper limit value of the temperature of the control element up to which its normal operation is ensured, and a control element having low heat resistance can be used.

DETAILED DESCRIPTION OF PREFERRED EMBODIMENTS

Figure 1:
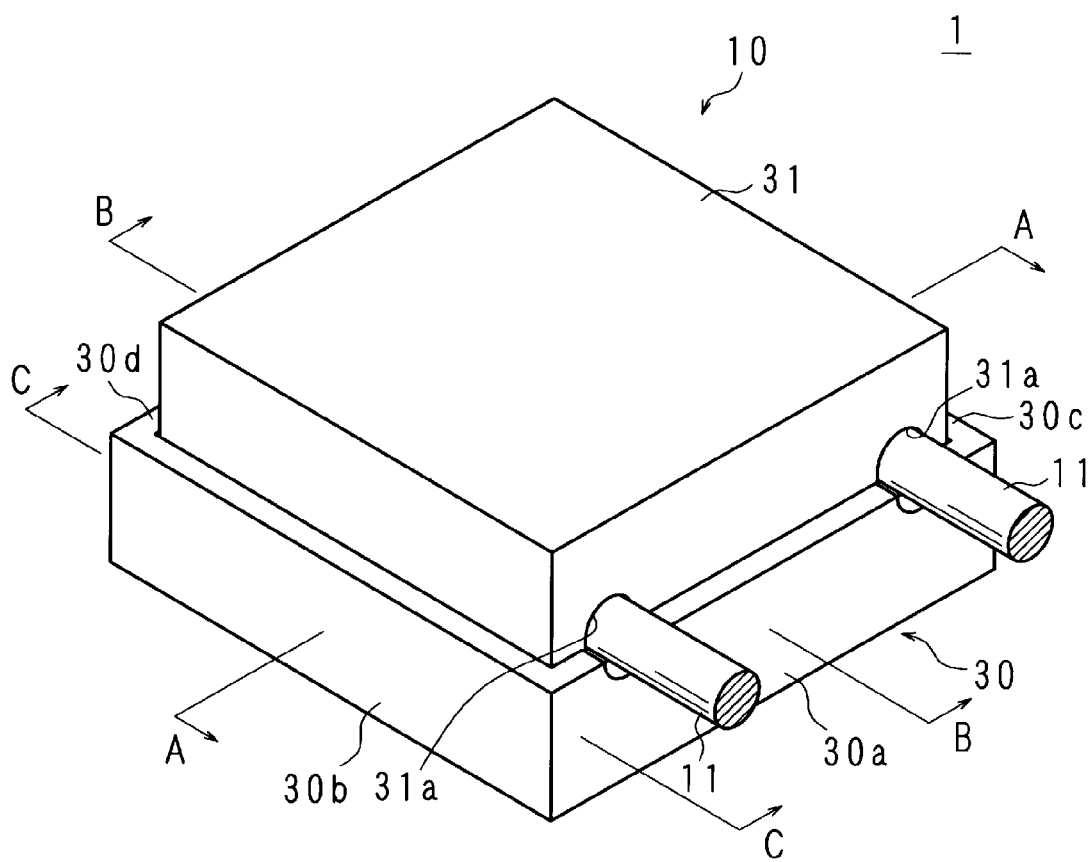
FIG. 1 is a perspective view of an electrical junction box in the present embodiment.

First, aspects of implementation of the present disclosure will be listed and described. At least some of the following embodiments may also be combined as desired.

A circuit device according to one aspect of the present disclosure is a circuit device in which a circuit component is electrically connected to a conductor that is attached to an attachment surface of a first heat dissipation member with an insulation member interposed between the conductor and the attachment surface, the circuit device including a control element that outputs a control signal for controlling operation of the circuit component, a circuit board on which the control element is arranged and that is spaced apart from the first heat dissipation member and the conductor, and a housing member that includes a housing chamber that houses the circuit component and the circuit board, a heat dissipation chamber through which air flows while being in contact with a heat dissipation surface of a second heat dissipation member, and a partition plate that separates the heat dissipation chamber and the housing chamber from each other and has a plurality of communication holes through which the heat dissipation chamber and the housing chamber are in communication with each other, wherein a portion of the first heat dissipation member excluding the attachment surface and a portion of the second heat dissipation member excluding the heat dissipation surface are in contact with air outside the circuit device.

According to this aspect, the circuit board is spaced apart from the conductor and the first heat dissipation member, and therefore heat generated by the circuit component is not conducted via the conductor or the first heat dissipation member to the control element. Accordingly, even if the temperature of the circuit component increases, the temperature of the control element does not increase. As a result, the upper limit value of an allowable temperature of the circuit component is not limited by the upper limit value of the temperature of the control element up to which its normal operation is ensured. Furthermore, a control element that has low heat resistance can be used because heat generated by the circuit component is not conducted to the control element.

Heat generated by the circuit component is conducted via the conductor and the insulation member to the first heat dissipation member, and therefore the temperature of the circuit component decreases. Heat conducted to the first heat dissipation member dissipates from the first heat dissipation member to the outside of the circuit device.

Also, heat generated by each of the circuit component and the control element is conducted to air inside the housing chamber. Air to which heat has been conducted rises and causes convection, and thus heat is continuously carried away from the circuit component and the control element, and therefore the temperatures of the circuit component and the control element decrease.

Air inside the housing chamber flows through a communication hole into the heat dissipation chamber as a result of convection occurring in the air due to a temperature difference or the air expanding due to heat conduction from the circuit component and the control element, for example. Air inside the heat dissipation chamber is cooled as a result of coming into contact with the second heat dissipation member. Heat conducted from the air inside the heat dissipation chamber to the second heat dissipation member dissipates from the second heat dissipation member to the outside of the circuit device. Cooled air inside the heat dissipation chamber flows through another communication hole into the housing chamber as a result of being replaced by air flowing into the heat dissipation chamber, for example. Thus, air flows through the heat dissipation chamber while being in contact with the heat dissipation surface of the second heat dissipation member, and convection occurs such that air circulates between the housing chamber and the heat dissipation chamber, and therefore heat dissipation from the circuit component and the control element to the outside of the circuit device is promoted.

In a circuit device according to one aspect of the present disclosure, the housing member is sealed in a liquid-tight manner.

According to this aspect, the housing chamber and the heat dissipation chamber are sealed in a liquid-tight manner, and therefore the intrusion of water, dust, or the like, which causes an adverse effect on the circuit component when coming into contact with the circuit component, is prevented.

In a circuit device according to one aspect of the present disclosure, the first heat dissipation member and the second heat dissipation member are formed as one piece, and constitute a portion of a wall member of the housing member.

According to this aspect, the first heat dissipation member and the second heat dissipation member are formed as one piece, and therefore the number of components is reduced. Furthermore, the first heat dissipation member and the second heat dissipation member constitute a portion of the wall member of the housing member, and therefore the interior space of the housing member is not narrowed by the first heat dissipation member or the second heat dissipation member.

In a circuit device according to one aspect of the present disclosure, the circuit device includes a plurality of the conductors, the circuit component is a semiconductor switch that is electrically connected to two of the plurality of conductors, and the control signal is a signal for turning the circuit component ON or OFF.

According to this aspect, current flows via the two conductors and the semiconductor switch, which functions as the circuit component. If the semiconductor switch is switched ON, current is allowed to flow via the two conductors, and if the semiconductor switch is switched OFF, current does not flow via the two conductors.

The following describes a specific example of an electrical junction box (circuit device) according to an embodiment of the present disclosure with reference to the accompanying drawings. Note that the present disclosure is not limited to this example, but is defined by the claims, and is intended to encompass all modifications within the meanings and scope that are equivalent to the claims.

FIG. 1 is a perspective view of an electrical junction box 1 in the present embodiment. The electrical junction box 1 is favorably mounted in a vehicle and functions as a circuit device. The electrical junction box 1 includes a box-shaped housing member 10 that is open on one side. The housing member 10 includes a rectangular frame member 30 and a box-shaped lid member 31 that is open on one side. The lid member 31 is arranged on the upper side of the electrical junction box 1 such that a bottom wall of the lid member 31 is located on the upper side and the open side of the lid member 31 is located on the lower side.

The lid member 31 covers the inside of the frame member 30 as a result of a lower end portion of the lid member 31 being fitted in the frame member 30.

Two cutouts 31a are provided in a lower side portion of a front side wall of the lid member 31. The two cutouts 31a are arranged in the left-right direction. Conductive wires 11 protrude forward from the two cutouts 31a, respectively.

Figure 2:
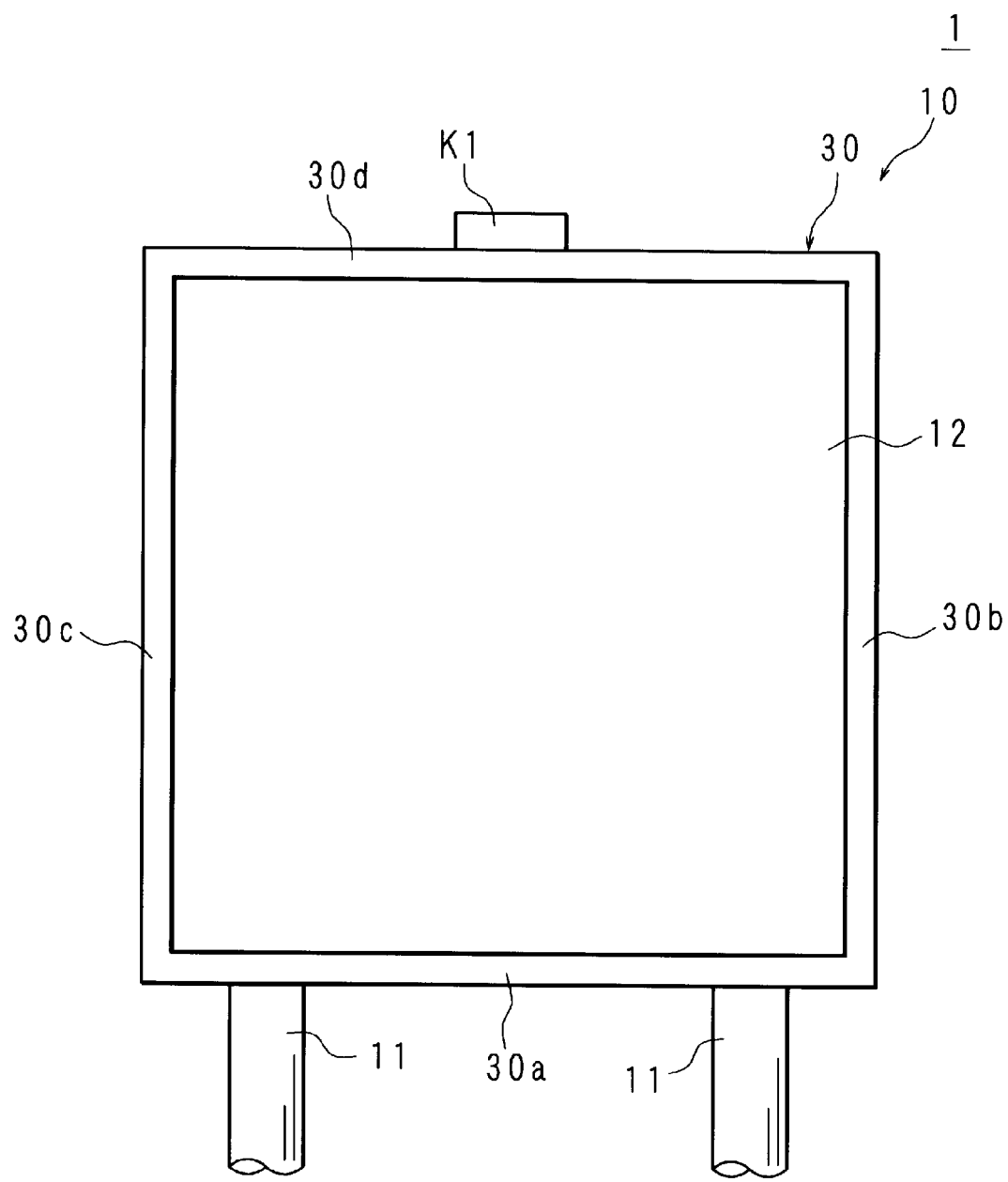
FIG. 2 is an external view of the lower side of the electrical junction box.

FIG. 2 is an external view of the lower side of the electrical junction box 1. The frame member 30 includes a front wall 30a, a left wall 30b, a right wall 30c, and a rear wall 30d that are located on the front side, the left side, the right side, and the rear side of the electrical junction box 1, respectively. These walls each have a rectangular plate-like shape. A left side portion and a right side portion of the front wall 30a are joined to front side portions of the left wall 30b and the right wall 30c, respectively. Rear side portions of the left wall 30b and the right wall 30c are joined to a left side portion and a right side portion of the rear wall 30d, respectively.

The electrical junction box 1 further includes a rectangular plate-shaped heat dissipation member 12. The heat dissipation member 12 is fitted in the frame member 30, and plate surfaces of the heat dissipation member 12 are substantially perpendicular to an axial direction of the frame member 30. End faces of the heat dissipation member 12 on its front side, left side, right side, and rear side respectively abut against plate surfaces of the front wall 30a, the left wall 30b, the right wall 30c, and the rear wall 30d of the frame member 30 of the housing member 10.

Figure 3:
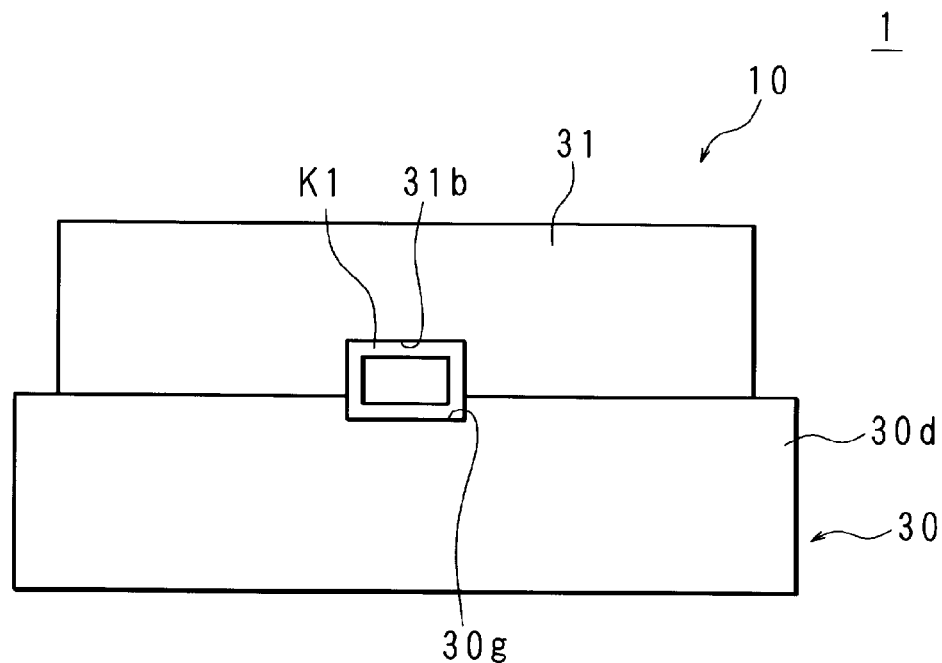
FIG. 3 is an external view of the rear side of the electrical junction box.

FIG. 3 is an external view of the rear side of the electrical junction box 1. A cutout 31b is provided in a lower side portion of a rear side wall of the lid member 31. A cutout 30g is provided in an upper side portion of the rear wall 30d of the frame member 30. In the electrical junction box 1 in which a portion of the lid member 31 is fitted in the frame member 30, an opening that extends in the front-rear direction is formed by the cutouts 30g and 31b, and a connector K1 protrudes from this opening.

A connector (not shown) that is provided at an end portion of a signal line (not shown) is fitted to the connector K1. A connection signal for electrically connecting the two conductive wires 11 and an interruption signal for interrupting the electrical connection between the two conductive wires 11 are output via this signal line to the electrical junction box 1.

In the electrical junction box 1, one of the conductive wires 11 is connected to a positive electrode of a battery (not shown), and the other conductive wire 11 is connected to one end of a load (not shown), for example. A negative electrode of the battery and the other end of the load are grounded. If a connection signal is input to the electrical junction box 1, the two conductive wires 11 are electrically connected to each other. Thus, the positive electrode of the battery is electrically connected to the one end of the load, and power is supplied to the load with current flowing from the battery to the load. If an interruption signal is input to the electrical junction box 1, the electrical connection between the two conductive wires 11 is interrupted. Thus, the electrical connection between the positive electrode of the battery and the one end of the load is interrupted. As a result, current does not flow from the battery to the load and power is not supplied to the load.

Figure 4:
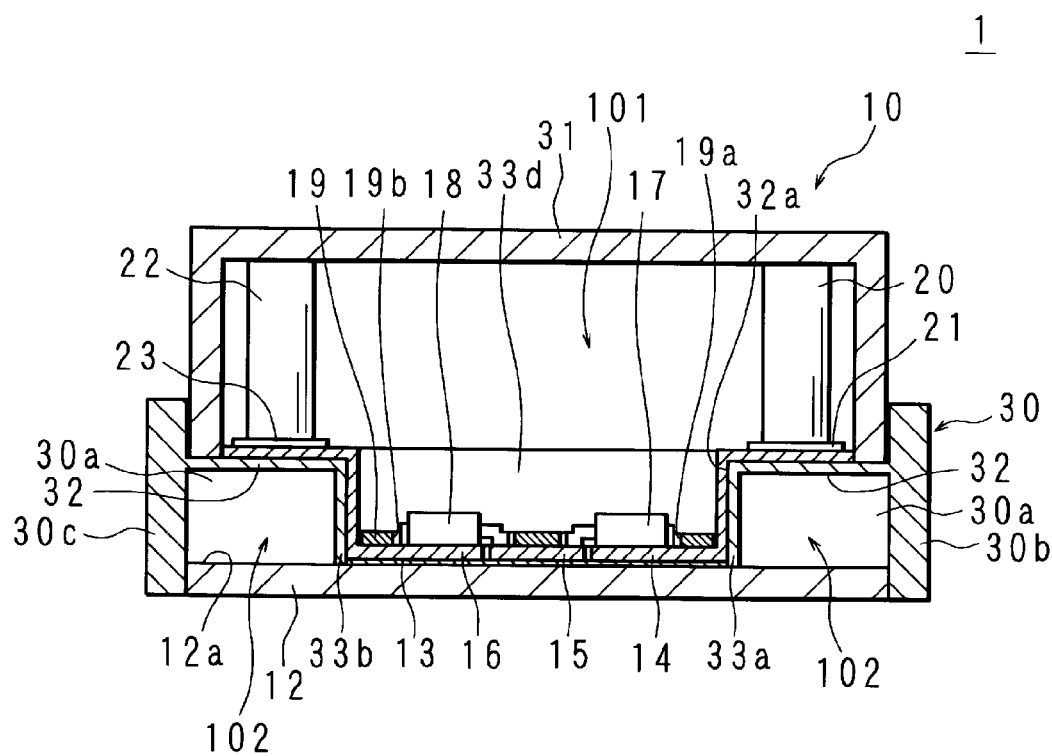
FIG. 4 is a cross-sectional view taken along line A-A in FIG. 1.

FIG. 4 is a cross-sectional view taken along line A-A in FIG. 1. Three plate-shaped conductors 14, 15, and 16 are placed on an upper surface 12a of the heat dissipation member 12 with 13 interposed therebetween. The conductors 14 and 16 are each bent a plurality of times. Portions of respective plate surfaces of the conductors 14 and 16 face the upper surface 12a of the heat dissipation member 12. A plate surface of the conductor 15 also faces the upper surface 12a of the heat dissipation member 12. The insulation member 13 also serves as an adhesive, and lower surfaces of the conductors 14, 15, and 16 are bonded to the upper surface 12a of the heat dissipation member 12 via the insulation member 13. Each of the conductors 14, 15, and 16 is spaced apart from the other two of the conductors 14, 15, and 16. Also, the conductors 14, 15, and 16 are insulated from the heat dissipation member 12 by the insulation member 13. The conductors 14, 15, and 16 are also known as bus bars.

The electrical junction box 1 further includes chip-shaped field-effect transistors (FETs) 17 and 18 that function as semiconductor switches. A drain terminal of the FET 17 is electrically connected to the conductor 14. Source terminals of the FETs 17 and 18 are electrically connected to the conductor 15. A drain terminal of the FET 18 is electrically connected to the conductor 16. A first circuit board 19 is placed on upper surfaces of the conductors 14, 15, and 16. A plate surface of the first circuit board 19 faces the upper surface of the heat dissipation member 12, and the first circuit board 19 has openings 19a and 19b that extend therethrough in the vertical direction. The openings 19a and 19b are arranged in the left-right direction. The FET 17 is arranged in the opening 19a and the FET 18 is arranged in the opening 19b. Gate terminals of the FETs 17 and 18 are connected to an upper surface of the first circuit board 19 (see FIGS. 6 and 7, which will be described later). The FETs 17 and 18 each function as a circuit component.

The voltages at the gate terminals of the FETs 17 and 18 are adjusted relative to a fixed potential, which is a ground potential, for example. The FETs 17 and 18 can be switched ON or OFF by adjusting the voltages at the gate terminals. The FETs 17 and 18 are switched ON or OFF substantially simultaneously. If the FET 17 is switched ON, the two conductors 14 and 15 are electrically connected to each other. If the FET 17 is switched OFF, the electrical connection between the two conductors 14 and 15 is interrupted. If the FET 18 is switched ON, the two conductors 15 and 16 are electrically connected to each other. If the FET 18 is switched OFF, the electrical connection between the two conductors 15 and 16 is interrupted.

If the FETs 17 and 18 are switched ON, current is allowed to flow via the three conductors 14, 15, and 16 and the FETs 17 and 18. If the FETs 17 and 18 are switched OFF, current does not flow via the three conductors 14, 15, and 16 and the FETs 17 and 18. When current flows via the FETs 17 and 18, the FETs 17 and 18 generate heat. Heat generated by the FET 17 is conducted by the conductors 14 and 15, the insulation member 13, and the heat dissipation member 12 in this order. Heat generated by the FET 18 is conducted by the conductors 15 and 16, the insulation member 13, and the heat dissipation member 12 in this order. Heat conducted to the heat dissipation member 12 dissipates from the heat dissipation member 12.

The conduction types of the FETs 17 and 18 are the same, and the source terminals of the FETs 17 and 18 are connected to the conductor 15 as described above. Therefore, if the conduction type of the FETs 17 and 18 is the N-channel type, the anode of a parasitic diode of the FET 17 is connected to the anode of a parasitic diode of the FET 18. If the conduction type of the FETs 17 and 18 is the P-channel type, the cathode of the parasitic diode of the FET 17 is connected to the cathode of the parasitic diode of the FET 18. Accordingly, if the FETs 17 and 18 are switched OFF, current does not flow via the parasitic diodes of the FETs 17 and 18.

As described above, the housing member 10 is box-shaped and is open on one side. The upper surface 12a of the heat dissipation member 12 is arranged on the open side of the housing member 10, and the opening of the housing member 10 is closed by the upper surface 12a as shown in FIG. 2. The housing member 10 covers the FETs 17 and 18 as shown in FIG. 4. The housing member 10 houses the FETs 17 and 18.

Figure 5:
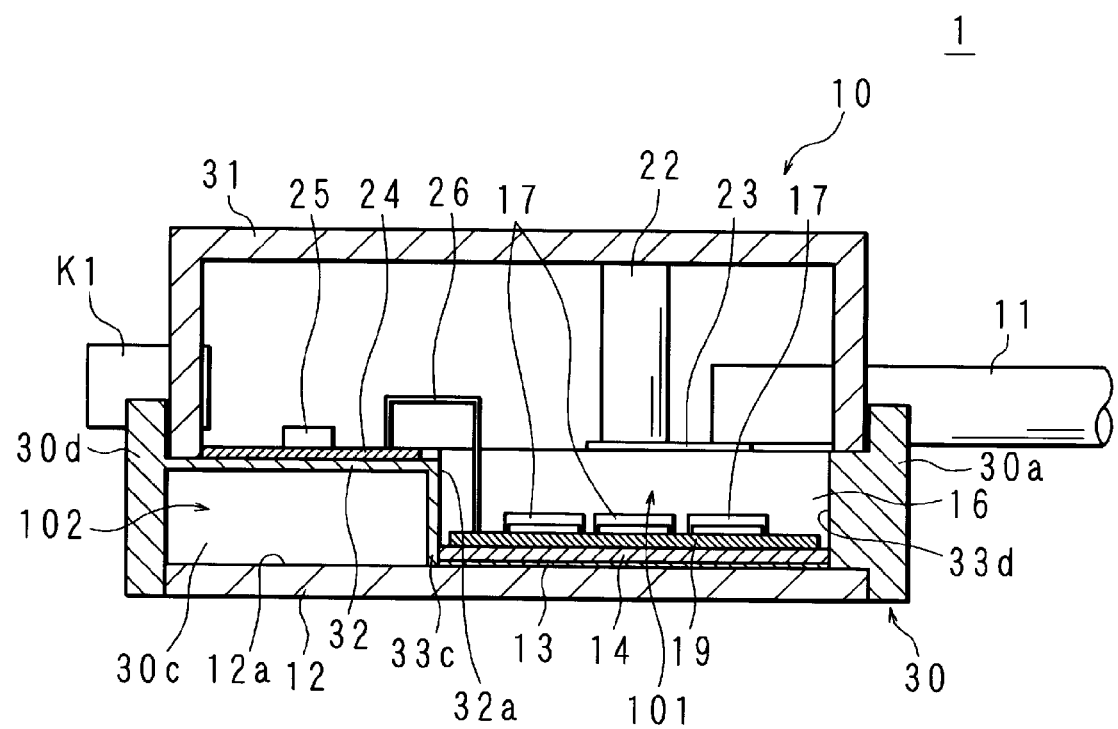
FIG. 5 is a cross-sectional view taken along line B-B in FIG. 1.
Figure 6:
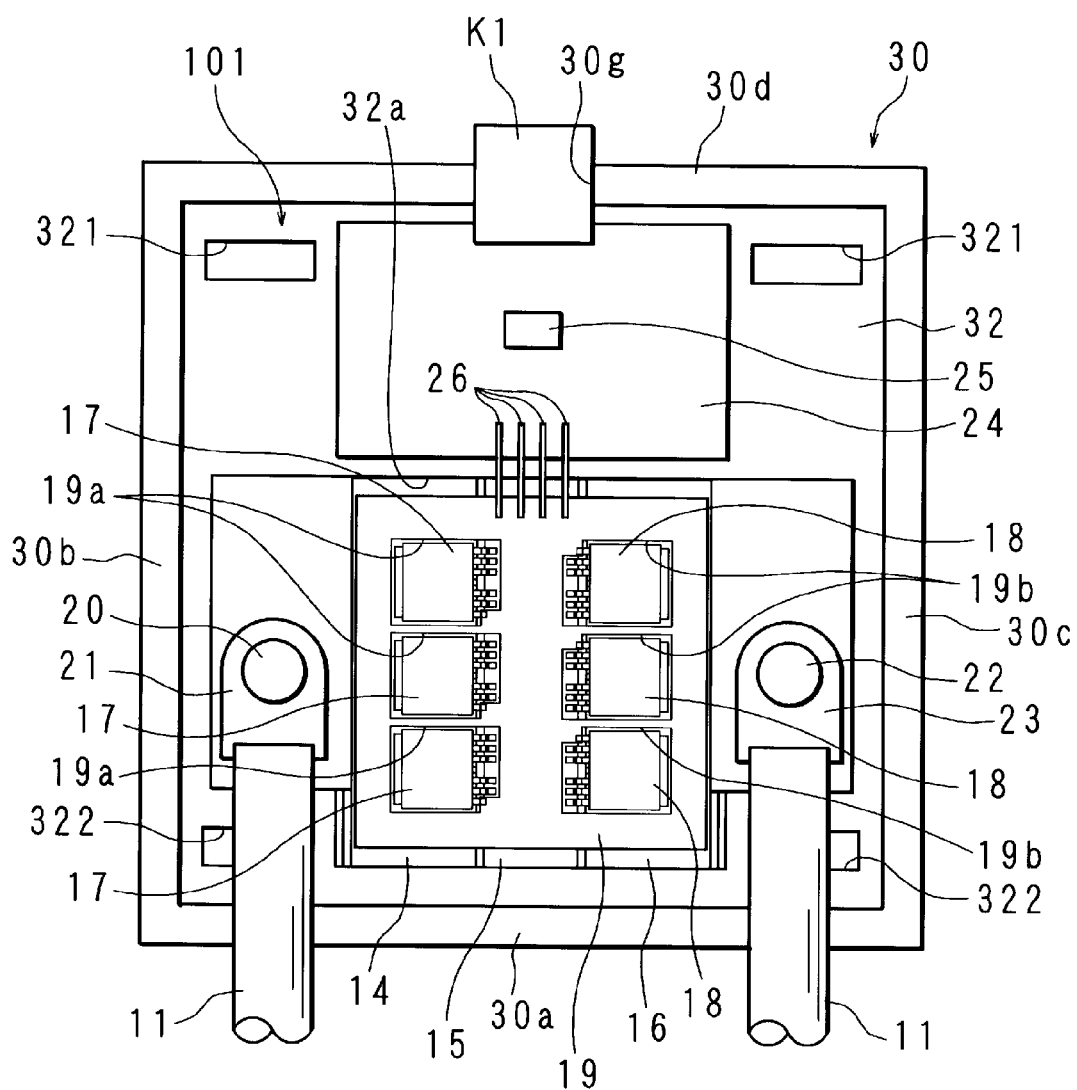
FIG. 6 is a plan view of the electrical junction box from which a lid member is removed.
Figure 7:
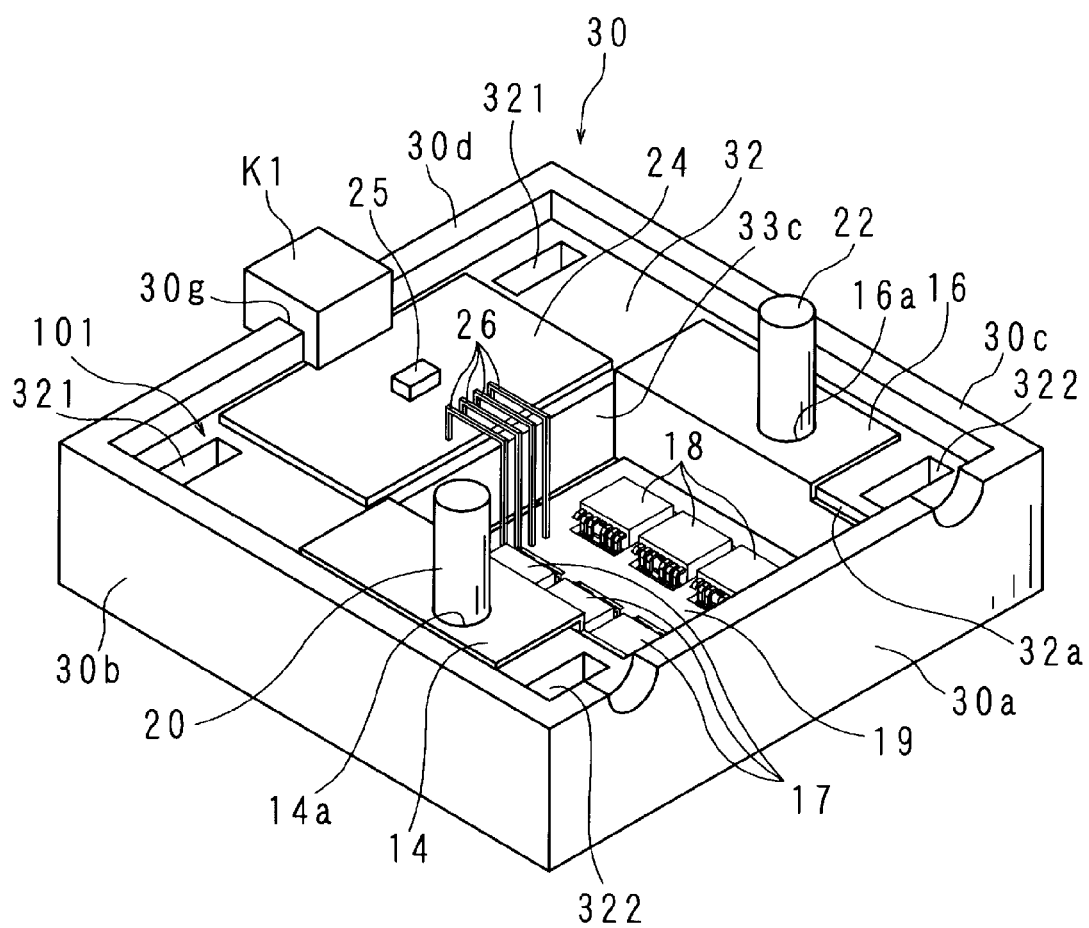
FIG. 7 is a perspective view of the electrical junction box from which the lid member is removed.

FIG. 5 is a cross-sectional view taken along line B-B in FIG. 1, and FIGS. 6 and 7 are respectively a plan view and a perspective view of the electrical junction box 1 from which the lid member 31 is removed. As shown in FIGS. 5 to 7, three FETs 17, three FETs 18, three openings 19a, and three openings 19b are provided. The three openings 19a are arranged in the front-rear direction on the left side of the first circuit board 19, and one FET 17 is arranged in each opening 19a. The three openings 19b are arranged in the front-rear direction on the right side of the first circuit board 19, and one FET 18 is arranged in each opening 19b. The six FETs 17 and 18 are switched ON or OFF substantially simultaneously.

Within the housing member 10, a support plate 32 protrudes toward the inside of the frame member 30 from midway positions on the front wall 30a, the left wall 30b, the right wall 30c, and the rear wall 30d of the frame member 30. A plate surface of the support plate 32 faces the upper surface 12a of the heat dissipation member 12 and is spaced apart from the upper surface 12a. As shown in FIG. 4, the conductor 14 covers a portion of an upper surface of the support plate 32 on the left side thereof, and the conductor 16 covers a portion of the upper surface of the support plate 32 on the right side thereof. The support plate 32 has a rectangular opening 32a. The first circuit board 19 and the bottom wall of the lid member 31 face each other in the vertical direction via the opening 32a.

The conductor 14 has an opening 14a that extends therethrough in the vertical direction, and a cylindrical stud bolt 20 protrudes upward from the upper surface of the support plate 32 on the left side thereof as shown in FIG. 4. The stud bolt 20 passes through the opening 14a of the conductor 14.

The stud bolt 20 is provided with a thread. The stud bolt 20 further passes through an annular connection terminal 21. In a state in which the stud bolt 20 passes through the annular connection terminal 21, a nut (not shown) is attached to the stud bolt 20. As a result of the nut being tightened, the connection terminal 21 is sandwiched between the conductor 14 and the nut and comes into contact with the conductor 14. Thus, the conductor 14 and the connection terminal 21 are electrically connected to each other. The connection terminal 21 is electrically connected to one of the two conductive wires 11.

Likewise, the conductor 16 has an opening 16a that extends therethrough in the vertical direction, and a cylindrical stud bolt 22 protrudes upward from the upper surface of the support plate 32 on the right side thereof as shown in FIG. 4. The stud bolt 22 passes through the opening 16a of the conductor 16. The stud bolt 22 is provided with a thread. The stud bolt 22 further passes through an annular connection terminal 23. In a state in which the stud bolt 22 passes through the annular connection terminal 23, a nut (not shown) is attached to the stud bolt 22. As a result of the nut being tightened, the connection terminal 23 is sandwiched between the conductor 16 and the nut and comes into contact with the conductor 16. Thus, the conductor 16 and the connection terminal 23 are electrically connected to each other. The connection terminal 23 is electrically connected to the other of the two conductive wires 11.

Upper end faces of the two stud bolts 20 and 22 abut against the bottom wall of the lid member 31.

The two conductive wires 11 and the connection terminals 21 and 23 are omitted in FIG. 7.

If the six FETs 17 and 18 are switched ON, current is allowed to flow through one conductive wire 11, the connection terminal 21, the conductor 14, the FETs 17, the conductor 15, the FETs 18, the conductor 16, the connection terminal 23, and the other conductive wire 11 in this order, and the two conductive wires 11 are electrically connected to each other. If the six FETs 17 and 18 are switched OFF, current does not flow via the six FETs 17 and 18, and therefore the electrical connection between the two conductive wires 11 is interrupted.

The electrical junction box 1 further includes a second circuit board (circuit board) 24 that is placed on a rear side portion of the upper surface of the support plate 32. As described above, the conductors 14, 15, and 16 are bonded to the heat dissipation member 12 and the support plate 32 is spaced apart from the heat dissipation member 12, and accordingly the second circuit board 24 is spaced apart from the heat dissipation member 12 and the conductors 14, 15, and 16. A plate surface of the second circuit board 24 faces the upper surface of the support plate 32. A chip-shaped control element 25 is arranged on an upper surface of the second circuit board 24. The control element 25 is a microcomputer, for example. A drive circuit (not shown) for switching the six FETs 17 and 18 ON or OFF substantially simultaneously is provided on the second circuit board 24.

Conductive patterns (not shown) are provided on upper surfaces of the first circuit board 19 and the second circuit board 24. The conductive pattern on the first circuit board 19 is electrically connected to the conductive pattern on the second circuit board 24 by four conductive connection bodies 26. The connector K1 is electrically connected to the control element 25 by the conductive pattern on the second circuit board 24, and the control element 25 is electrically connected to the drive circuit by the conductive pattern on the second circuit board 24. The drive circuit is electrically connected to the gate terminals of the six FETs 17 and 18 by the conductive pattern on the second circuit board 24, the connection bodies 26, and the conductive pattern on the first circuit board 19.

As described above, the connector provided at the end portion of the signal line is fitted to the connector K1. Connection signals and interruption signals output via the signal line to the electrical junction box 1 are input via the connector K1 to the control element 25. If a connection signal is input, the control element 25 outputs a control signal for turning the six FETs 17 and 18 ON to the drive circuit, and if an interruption signal is input, the control element 25 outputs a control signal for turning the six FETs 17 and 18 OFF to the drive circuit.

If a control signal for turning the six FETs 17 and 18 ON is output by the control element 25 to the drive circuit, the drive circuit switches the six FETs 17 and 18 ON substantially simultaneously by adjusting the voltages at the gate terminals of the six FETs 17 and 18 relative to the fixed potential. If a control signal for turning the six FETs 17 and 18 OFF is output by the control element 25, the drive circuit switches the six FETs 17 and 18 OFF substantially simultaneously by adjusting the voltages at the gate terminals of the six FETs 17 and 18 relative to the fixed potential. The control signals are signals for controlling operation of the FETs 17 and 18.

Let's assume that one conductive wire 11 is connected to the positive electrode of the battery, the other conductive wire 11 is connected to one end of the load, and the negative electrode of the battery and the other end of the load are grounded. In this case, if the six FETs 17 and 18 are switched ON, power is supplied to the load with current flowing from the battery to the load via the six FETs 17 and 18. At this time, the six FETs 17 and 18 generate heat. In the same case, if the six FETs 17 and 18 are switched OFF, current does not flow via the six FETs 17 and 18, and the six FETs 17 and 18 do not generate heat.

Figure 8:
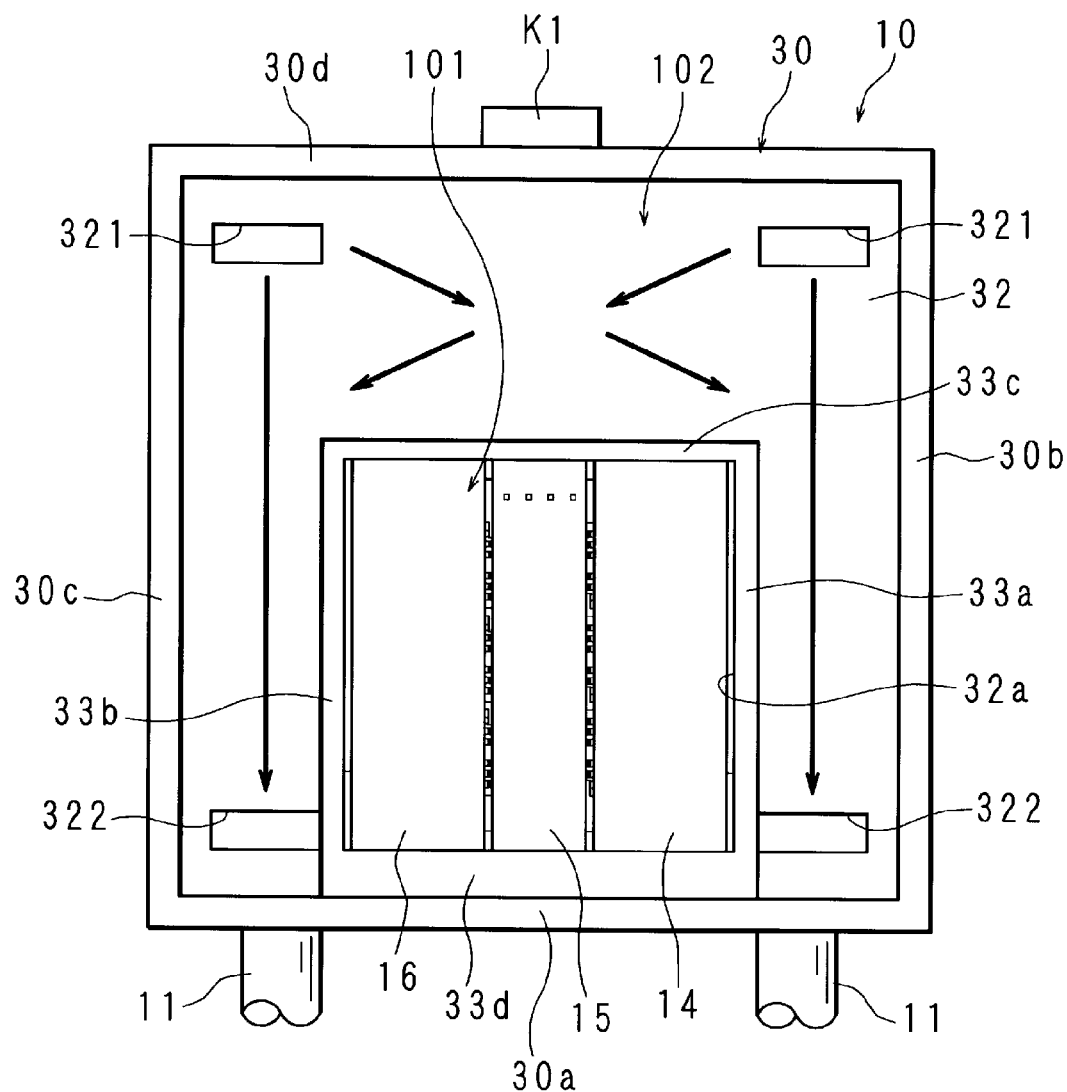
FIG. 8 is an external view of the lower side of the electrical junction box from which a heat dissipation member is removed.
Figure 9:
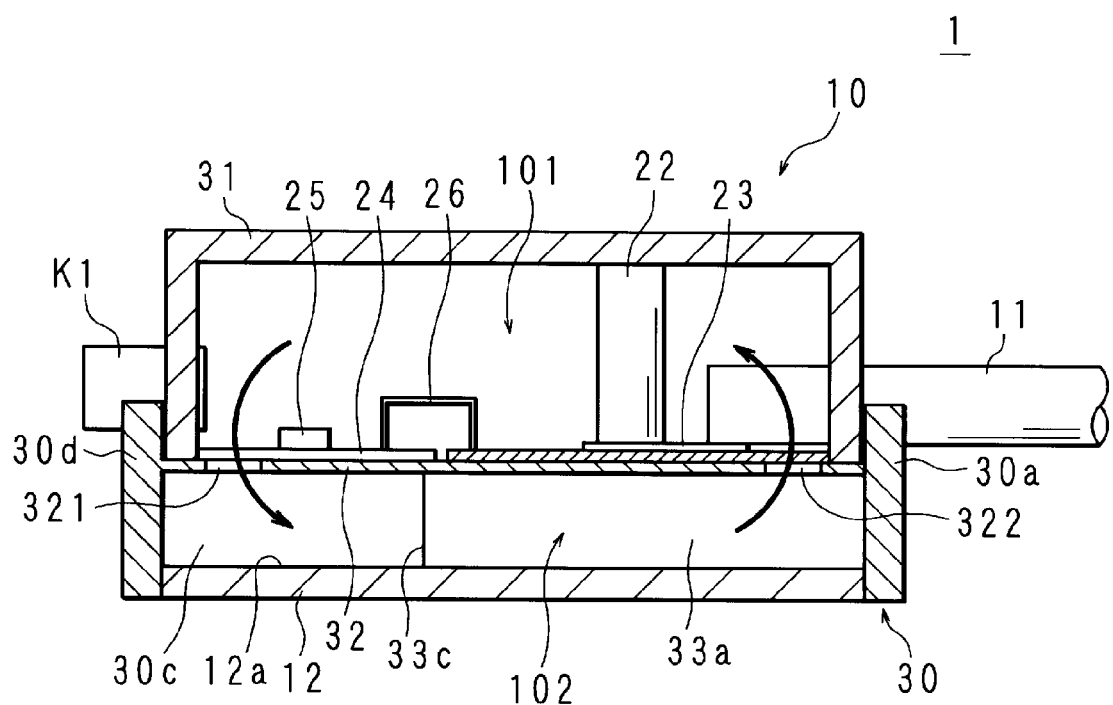
FIG. 9 is a cross-sectional view taken along line C-C in FIG. 1.

FIG. 8 is an external view of the lower side of the electrical junction box 1 from which the heat dissipation member 12 is removed, and FIG. 9 is a cross-sectional view taken along line C-C in FIG. 1. As shown in FIGS. 4, 5, and 7 to 9, a left-side partition plate 33a, a right-side partition plate 33b, a rear-side partition plate 33c, and a protruding portion 33d are arranged within the housing member 10. The left-side partition plate 33a, the right-side partition plate 33b, and the rear-side partition plate 33c each have a rectangular shape, and protrude downward from a left side portion, a right side portion, and a rear side portion of the opening 32a of the support plate 32, respectively. A plate surface of the left-side partition plate 33a faces a plate surface of the left wall 30b of the frame member 30. A plate surface of the right-side partition plate 33b faces a plate surface of the right wall 30c of the frame member 30. A plate surface of the rear-side partition plate 33c faces a plate surface of the rear wall 30d of the frame member 30. The protruding portion 33d has the shape of a rectangular plate that protrudes downward from a front side portion of the opening 32a of the support plate 32. A plate surface of the protruding portion 33d faces a plate surface of the rear-side partition plate 33c, and the other plate surface of the protruding portion 33d is joined to an inner surface of the front wall 30a.

As shown in FIG. 8, a left side portion and a right side portion of the protruding portion 33d are joined to front side portions of the left-side partition plate 33a and the right-side partition plate 33b, respectively. Rear side portions of the left-side partition plate 33a and the right-side partition plate 33b are joined to a left side portion and a right side portion of the rear-side partition plate 33c, respectively.

As shown in FIGS. 4 and 5, lower end faces of the left-side partition plate 33a, the right-side partition plate 33b, the rear-side partition plate 33c, and the protruding portion 33d abut against the upper surface 12a of the heat dissipation member 12.

A housing chamber 101 and a heat dissipation chamber 102 are provided in the housing member 10.

The housing chamber 101 is surrounded by the lid member 31, the support plate 32, the left-side partition plate 33a, the right-side partition plate 33b, the rear-side partition plate 33c, the protruding portion 33d, and the heat dissipation member 12 (first heat dissipation member). The housing chamber 101 houses the insulation member 13, the conductors 14, 15, and 16, the FETs 17 and 18, the first circuit board 19, the second circuit board 24, and the like.

The heat dissipation chamber 102 is surrounded by the front wall 30a, the left wall 30b, the right wall 30c, the rear wall 30d, the support plate 32, the left-side partition plate 33a, the right-side partition plate 33b, the rear-side partition plate 33c, and the heat dissipation member 12 (second heat dissipation member). As shown in FIG. 8, the heat dissipation chamber 102 includes a rear-side heat dissipation chamber that extends in the left-right direction along the rear wall 30d, a left-side heat dissipation chamber that extends forward from a left end portion of the rear-side heat dissipation chamber along the left wall 30b, and a right-side heat dissipation chamber that extends forward from a right end portion of the rear-side heat dissipation chamber along the right wall 30c.

The heat dissipation member 12 is a portion of a wall member that constitutes the housing member 10, and a portion of the upper surface 12a faces the inside of the housing chamber 101, and another portion of the upper surface 12a faces the inside of the heat dissipation chamber 102. A lower surface of the heat dissipation member 12 is in contact with air outside the electrical junction box 1. The portion of the upper surface 12a facing the inside of the housing chamber 101 serves as an attachment surface, and the portion of the upper surface 12a facing the inside of the heat dissipation chamber 102 serves as a heat dissipation surface.

The support plate 32 serves as a partition plate that separates the housing chamber 101 and the heat dissipation chamber 102 from each other in the vertical direction. The support plate 32 has four communication holes 321 and 322 that are provided near the four corners of the frame member 30. Two communication holes 321 are arranged in the left-right direction along the rear wall 30d. The communication holes 322 are provided on the front side of the communication holes 321. The communication holes 321 and 322 extend through the support plate 32 in the vertical direction, and the housing chamber 101 and the heat dissipation chamber 102 are in communication with each other through the communication holes. More specifically, the housing chamber 101 and a rear end portion of the left-side heat dissipation chamber (and the left end portion of the rear-side heat dissipation chamber) of the heat dissipation chamber 102 are in communication with each other through the left communication hole 321, and the housing chamber 101 and a front end portion of the left-side heat dissipation chamber of the heat dissipation chamber 102 are in communication with each other through the left communication hole 322. On the other hand, the housing chamber 101 and a rear end portion of the right-side heat dissipation chamber (and the right end portion of the rear-side heat dissipation chamber) of the heat dissipation chamber 102 are in communication with each other through the right communication hole 321, and the housing chamber 101 and a front end portion of the right-side heat dissipation chamber of the heat dissipation chamber 102 are in communication with each other through the right communication hole 322.

The housing member 10 is sealed in a liquid-tight manner. In order to seal the housing member 10 in a liquid-tight manner, a rubber bushing (not shown) is arranged between the housing member 10 and each of the connector K1 and the two conductive wires 11, for example. The frame member 30 and the lid member 31 are bonded to each other using a waterproof adhesive, and the frame member 30 and the heat dissipation member 12 are bonded to each other using a waterproof adhesive. As a result, the intrusion of water, dust, or the like, which causes an adverse effect on the FETs 17 and 18 when coming into contact with the FETs 17 and 18, is prevented. An example of the adverse effect is a malfunction of the FETs 17 and 18 that is caused as a result of water, dust, or the like coming into contact with the FETs 17 and 18.

In the electrical junction box 1 configured as described above, the second circuit board 24 is spaced apart from the heat dissipation member 12 and the conductors 14, 15, and 16, and therefore heat generated by the FETs 17 and 18 is not conducted via the conductors 14, 15, and 16 or the heat dissipation member 12 to the control element 25. Accordingly, even if the temperature of the FETs 17 and 18 increases, the temperature of the control element 25 does not increase. As a result, the upper limit value of an allowable temperature of the FETs 17 and 18 is not limited by the upper limit value of the temperature of the control element 25 up to which its normal operation is ensured. Furthermore, a control element 25 that has low heat resistance can be used because heat generated by the FETs 17 and 18 is not conducted to the control element 25.

Heat generated by the FETs 17 and 18 is conducted via the conductors 14, 15, and 16 and the insulation member 13 to the heat dissipation member 12 as described above, and therefore the temperature of the FETs 17 and 18 decreases. Heat conducted to the heat dissipation member 12 dissipates from the heat dissipation member 12 to the outside of the electrical junction box 1.

Also, heat generated by each of the FETs 17 and 18 and the control element 25 is conducted to air inside the housing chamber 101. Air to which heat has been conducted rises and causes convection, and thus heat is continuously carried away from the FETs 17 and 18 and the control element 25, and therefore the temperatures of the FETs 17 and 18 and the control element 25 decrease.

Air inside the housing chamber 101 flows through the communication holes 321 into the heat dissipation chamber 102 as a result of convection occurring in the air due to a temperature difference or the air expanding due to heat conduction from the FETs 17 and 18 and the control element 25, for example. Air inside the heat dissipation chamber 102 is cooled as a result of coming into contact with the heat dissipation member 12. Heat conducted from the air inside the heat dissipation chamber 102 to the heat dissipation member 12 dissipates from the heat dissipation member 12 to the outside of the electrical junction box 1.

Cooled air inside the heat dissipation chamber 102 flows through the communication holes 322 into the housing chamber 101 as a result of being replaced by air flowing into the heat dissipation chamber 102, for example. Thus, air flows through the heat dissipation chamber 102 while being in contact with the heat dissipation surface of the heat dissipation member 12, and convection occurs such that air circulates between the housing chamber 101 and the heat dissipation chamber 102, and therefore heat dissipation from the FETs 17 and 18 and the control element 25 to the outside of the electrical junction box 1 is promoted.

In the present embodiment, the heat dissipation member 12 serves as both the first heat dissipation member and the second heat dissipation member. That is, the first heat dissipation member and the second heat dissipation member are formed as one piece, and therefore the number of components is reduced.

Furthermore, the heat dissipation member 12 constitutes a portion of the wall member of the housing member 10, and therefore the interior space of the housing member 10 is not narrowed by the heat dissipation member 12.

Note that the first heat dissipation member constituting the housing chamber 101 and the second heat dissipation member constituting the heat dissipation chamber 102 may be separate members.

Convection occurring in the housing member 10 is not limited to the above-described flow. For example, air inside the housing chamber 101 may flow through the communication holes 322 into the heat dissipation chamber 102, and air inside the heat dissipation chamber 102 may flow through the communication holes 321 into the housing chamber 101.

The number of communication holes is not limited to four. The communication holes are not required to be provided in the support plate 32, and may be provided in the left-side partition plate 33a, the right-side partition plate 33b, or the rear-side partition plate 33c.

The terminals of the FETs 17 and 18 connected to the conductor 15 are not limited to source terminals, and may be drain terminals. In this case, the source terminals of the FETs 17 are connected to the conductor 14, and the source terminals of the FETs 18 are connected to the conductor 16. In a case in which the drain terminals of the FETs 17 and 18 are connected to the conductor 15 as well, the cathodes of the parasitic diodes of the FETs 17 are connected to the cathodes of the parasitic diodes of the FETs 18, or the anodes of the parasitic diodes of the FETs 17 are connected to the anodes of the parasitic diodes of the FETs 18. Accordingly, if the FETs 17 and 18 are switched OFF, current does not flow via the parasitic diodes of the FETs 17 and 18.

The number of FETs 17 and the number of FETs 18 are not limited to three, and may also be one, two, or four or more. A configuration is also possible in which the number of FETs 17 is not the same as the number of FETs 18.

The FETs 17 and 18 are only required to function as semiconductor switches, and therefore bipolar transistors, insulated gate bipolar transistors (IGBTs), or the like may be used instead of the FETs 17 and 18. If parasitic diodes are not formed in semiconductor switches, current does not flow via the semiconductor switches when the semiconductor switches are switched OFF. Therefore, if parasitic diodes are not formed in the semiconductor switches, a configuration is also possible that does not include semiconductor switches that are electrically connected between the conductors 15 and 16. In this case, the conductors 15 and 16 are formed as one piece and are treated as one conductor. In this case, the number of conductors is two.

The circuit configuration of the electrical junction box 1 can be applied to a device in which a circuit component that generates heat is electrically connected to a conductor that is placed on an attachment surface of a heat dissipation member with an insulation member interposed therebetween. In this case, circuit components connected to the conductors 14, 15, and 16 are not limited to semiconductor switches and are only required to be components that generate heat. Also, the number of conductors is not limited to two or three, and may also be one or four or more.

The disclosed embodiment is an illustrative example in all aspects and should not be considered as restrictive. The scope of the present disclosure is defined not by the above descriptions but by the claims, and is intended to encompass all modifications within the meanings and scope that are equivalent to the claims.

The invention claimed is:

1. A circuit device in which a circuit component is electrically connected to a conductor that is attached to an attachment surface of a first heat dissipation member with an insulation member interposed between the conductor and the attachment surface, the circuit device comprising:
   a control element configured to output a control signal for controlling operation of the circuit component;
   a circuit board on which the control element is arranged and that is spaced apart from the first heat dissipation member and the conductor; and
   a housing member that includes a housing chamber that houses the circuit component and the circuit board, a heat dissipation chamber through which air flows while being in contact with a heat dissipation surface of a second heat dissipation member, and a partition plate that bounds a periphery of the circuit board so as to define an open top and separate the heat dissipation chamber and the housing chamber from each other, a support plate covers the open top, the support plate includes a plurality of communication holes through which the heat dissipation chamber and the housing chamber are in communication with each other,
   wherein a portion of the first heat dissipation member excluding the attachment surface and a portion of the second heat dissipation member excluding the heat dissipation surface are in contact with air outside the circuit device.

2. The circuit device according to claim 1, wherein the housing member is sealed in a liquid-tight manner.

3. The circuit device according to claim 1, wherein the first heat dissipation member and the second heat dissipation member are formed as one piece, and constitute a portion of a wall member of the housing member.

4. The circuit device according to claim 1, wherein the circuit device includes a plurality of the conductors,
   the circuit component is a semiconductor switch that is electrically connected to two of the plurality of conductors, and
   the control signal is a signal for turning the circuit component ON or OFF.

5. The circuit device according to claim 2, wherein the first heat dissipation member and the second heat dissipation member are formed as one piece, and constitute a portion of a wall member of the housing member.

6. The circuit device according to claim 2,
   wherein the circuit device includes a plurality of the conductors,
   the circuit component is a semiconductor switch that is electrically connected to two of the plurality of conductors, and
   the control signal is a signal for turning the circuit component ON or OFF.

7. The circuit device according to claim 3,
   wherein the circuit device includes a plurality of the conductors,
   the circuit component is a semiconductor switch that is electrically connected to two of the plurality of conductors, and
   the control signal is a signal for turning the circuit component ON or OFF.

* * * * *